US006913523B2

(12) United States Patent
Sharples et al.

(10) Patent No.: US 6,913,523 B2
(45) Date of Patent: *Jul. 5, 2005

(54) METHOD FOR CONTROLLING PH DURING PLANARIZATION AND CLEANING OF MICROELECTRONIC SUBSTRATES

(75) Inventors: Judson R. Sharples, Boise, ID (US); Kenneth F. Zacharias, Boise, ID (US); Guy F. Hudson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/806,765

(22) Filed: Mar. 22, 2004

(65) Prior Publication Data

US 2004/0192174 A1 Sep. 30, 2004

Related U.S. Application Data

(63) Continuation of application No. 09/843,293, filed on Apr. 24, 2001, now Pat. No. 6,716,089, which is a continuation of application No. 09/122,187, filed on Jul. 23, 1998, now Pat. No. 6,220,934.

(51) Int. Cl.$^7$ .................................................. B24B 7/00
(52) U.S. Cl. ........................... 451/56; 451/41; 451/285; 438/692
(58) Field of Search .......................... 451/56, 41, 37, 451/54, 60, 63, 65, 67, 72, 285–290; 438/692, 693; 216/88, 89, 91

(56) References Cited

U.S. PATENT DOCUMENTS

| 3,638,366 A | 2/1972 | Gamache ..................... 51/326 |
| 3,841,031 A | 10/1974 | Walsh ......................... 51/283 |
| 3,957,553 A | 5/1976 | Smith .......................... 156/22 |
| 4,638,553 A | 1/1987 | Nilarp .......................... 29/580 |
| 4,879,258 A | 11/1989 | Fisher ......................... 437/225 |
| 4,903,440 A | 2/1990 | Larson et al. .................. 51/298 |
| 4,910,155 A | 3/1990 | Cote et al. ...................... 437/8 |
| 4,927,432 A | 5/1990 | Budinger et al. ............. 51/298 |
| 4,954,141 A | 9/1990 | Takiyama et al. ............. 51/296 |

(Continued)

FOREIGN PATENT DOCUMENTS

| EP | 0685299 A1 | 12/1995 | .......... B24B/37/04 |
| EP | 0708160 A2 | 4/1996 | ............ C09G/1/02 |
| JP | 408064562 A | 3/1996 | ......... H01L/21/304 |
| JP | 08112740 A | 5/1996 | ............ B24B/1/00 |
| WO | WO96/16436 | 5/1996 | ....... H01L/21/3105 |

OTHER PUBLICATIONS

Uematsu et al., "Efficient Mechanochemical Polishing for Silicon Nitride Ceramics", *NIST Spec. Publ.* 847, (Machining of Advanced Materials): 409–413, 1993.

*Primary Examiner*—Lee D. Wilson
*Assistant Examiner*—Anthony Ojini
(74) *Attorney, Agent, or Firm*—Dorsey & Whitney LLP

(57) ABSTRACT

A method and apparatus for processing a microelectronic substrate. In one embodiment, the method can include planarizing the microelectronic substrate with a planarizing liquid and rinsing the substrate with a rinsing liquid having a pH approximately the same as a pH of the planarizing liquid. The rinsing step can be completed while the substrate remains on a polishing pad of the apparatus, or, alternatively, the substrate can be removed to a rinsing chamber for rinsing. In another embodiment, the method can include conditioning the polishing pad by removing polishing pad material from the polishing pad and then cleaning the microelectronic substrate by engaging the substrate with the same polishing pad and moving at least one of the polishing pad and the substrate relative to the other of the polishing pad and the substrate after conditioning the polishing pad.

16 Claims, 3 Drawing Sheets

U.S. PATENT DOCUMENTS

| | | | |
|---|---|---|---|
| 4,954,142 A | 9/1990 | Carr et al. | 51/309 |
| 4,962,776 A | 10/1990 | Liu et al. | 134/11 |
| 4,973,563 A | 11/1990 | Prigge et al. | 437/225 |
| 4,992,135 A | 2/1991 | Doan | 156/636 |
| 5,174,816 A | 12/1992 | Aoyama et al. | 106/203 |
| 5,209,816 A | 5/1993 | Yu et al. | 156/636 |
| 5,262,354 A | 11/1993 | Cote et al. | 437/195 |
| 5,300,155 A | 4/1994 | Sandhu et al. | 148/33 |
| 5,318,927 A | 6/1994 | Sandhu et al. | 437/225 |
| 5,335,453 A | 8/1994 | Baldy et al. | 51/67 |
| 5,340,370 A | 8/1994 | Cadien et al. | 51/308 |
| 5,354,490 A | 10/1994 | Yu et al. | 252/79.1 |
| 5,389,194 A | 2/1995 | Rostoker et al. | 156/636 |
| 5,391,258 A | 2/1995 | Brancaleoni et al. | 156/636 |
| 5,397,397 A | 3/1995 | Awad | 134/1 |
| 5,453,312 A | 9/1995 | Haas et al. | 428/143 |
| 5,456,627 A | 10/1995 | Jackson et al. | 451/11 |
| 5,482,497 A | 1/1996 | Gonnella et al. | 451/57 |
| 5,492,858 A | 2/1996 | Bose et al. | 437/67 |
| 5,551,986 A | 9/1996 | Jain | 134/6 |
| 5,575,885 A | 11/1996 | Hirabayashi et al. | 156/626.1 |
| 5,578,362 A | 11/1996 | Reinhardt et al. | 428/147 |
| 5,578,523 A | 11/1996 | Fiordalice et al. | 437/190 |
| 5,624,303 A | 4/1997 | Robinson | 451/285 |
| 5,643,044 A | 7/1997 | Lund | 451/5 |
| 5,645,682 A | 7/1997 | Skrovan | 451/56 X |
| 5,679,169 A | 10/1997 | Gonzales et al. | 134/1.3 |
| 5,692,950 A | 12/1997 | Rutherford et al. | 451/552 |
| 5,707,492 A | 1/1998 | Stager et al. | 156/645.1 |
| 5,759,427 A | 6/1998 | Cibulsky et al. | 216/91 |
| 5,782,675 A * | 7/1998 | Southwick | 451/56 |
| 5,879,226 A * | 3/1999 | Robinson | 451/287 |
| 5,894,852 A | 4/1999 | Gonzales et al. | 134/1.3 |
| 5,938,505 A | 8/1999 | Morrison et al. | 451/36 |
| 5,972,792 A | 10/1999 | Hudson | 438/691 |
| 6,028,006 A * | 2/2000 | Bawa et al. | 438/692 |
| 6,054,015 A * | 4/2000 | Brunelli et al. | 156/345.12 |
| 6,060,396 A | 5/2000 | Fukami et al. | 438/693 |
| 6,220,934 B1 | 4/2001 | Sharples et al. | 451/36 |
| 6,368,194 B1 | 4/2002 | Sharples et al. | 451/67 |

* cited by examiner

METHOD FOR CONTROLLING PH DURING PLANARIZATION AND CLEANING OF MICROELECTRONIC SUBSTRATES

CROSS-REFERENCE TO RELATED APPLICATION

This application is a continuation of U.S. application Ser. No. 09/843,293, filed Apr. 24, 2001 now U.S. Pat. No. 6,716,089, which is a continuation of U.S. patent application Ser. No. 09/122,187, filed Jul. 23, 1998, now U.S. Pat. No. 6,220,934.

TECHNICAL FIELD

The present invention relates to mechanical and chemical-mechanical planarization of microelectronic substrates. More particularly, the present invention relates to controlling the pH of a microelectronic substrate during planarization and post-planarization processing of the microelectronic substrate.

BACKGROUND OF THE INVENTION

Mechanical and chemical-mechanical planarization processes remove material from the surfaces of semiconductor wafers, field emission displays, and many other microelectronic substrates to form a flat surface at a desired elevation. FIG. 1 schematically illustrates a planarizing machine 10 with a platen or base 20, a carrier assembly 30, a polishing pad 41 positioned on the platen 20, and a planarizing liquid 44 on the polishing pad 41. The planarizing machine 10 can also have an under-pad 25 attached to an upper surface 22 of the platen 20 for supporting the polishing pad 41. In many planarizing machines, a drive assembly 26 rotates (arrow A) and/or reciprocates (arrow B) the platen 20 to move the polishing pad 41 during planarization.

The carrier assembly 30 controls and protects a substrate 12 during planarization. The carrier assembly 30 generally has a substrate holder 32 with a pad 34 that holds the substrate 12 via suction. A carrier drive assembly 36 typically rotates and/or translates the substrate holder 32 (arrows C and D, respectively). Alternatively, the substrate holder 32 can include a weighted, free-floating disk (not shown) that slides over the polishing pad 41.

The combination of the polishing pad 41 and the planarizing liquid 44 generally defines a planarizing medium 40 that mechanically and/or chemically-mechanically removes material from the surface of the substrate 12. The polishing pad 41 may be a conventional polishing pad composed of a polymeric material (e.g., polyurethane) without abrasive particles, or it may be an abrasive polishing pad with abrasive particles fixedly bonded to a suspension material. In a typical application, the planarizing liquid 44 may be a chemical-mechanical planarization slurry with abrasive particles and chemicals for use with a conventional non-abrasive polishing pad. In other applications, the planarizing liquid 44 may be a chemical solution without abrasive particles for use with an abrasive polishing pad. In any case, the planarizing liquid 44 can be pumped from a planarizing liquid supply 45 through a conduit 46, and through orifices 43 to a planarizing surface 42 of the polishing pad 41.

To planarize the substrate 12 with the planarizing machine 10, the carrier assembly 30 presses the substrate 12 against the planarizing surface 42 of the polishing pad 41 in the presence of the planarizing liquid 44. The platen 20 and/or the substrate holder 32 then move relative to one another to translate the substrate 12 across the planarizing surface 42. As a result, the abrasive particles and/or the chemicals of the planarizing medium 40 remove material from the surface of the substrate 12.

After the substrate 12 has been planarized, particulate matter, such as abrasive particles, particles removed from the polishing pad 41, and/or particles removed from the substrate 12 may adhere to the substrate. Accordingly, the substrate 12 can be rinsed to remove the particulate matter before the substrate 12 undergoes additional processing. One conventional approach to rinsing the substrate 12 is to pump a rinsing solution 53 from a rinsing solution supply 54 through the orifices 43 to the planarizing surface 42 of the polishing pad 41. The rinsing solution 53 rinses the substrate 12 while the substrate remains in situ on the polishing pad 41. The rinsing solution 53 may be introduced to the polishing pad 41 as the relative velocity between the substrate 12 and the polishing pad 41 is reduced or ramped down.

Another rinsing approach, which can be used in addition to or in lieu of the in situ approach discussed above, can include removing the substrate 12 from the polishing pad 41 with a substrate transporter 60 and moving the substrate 12 to a rinse chamber 50. The substrate transporter 60 can include a grasping device 62 that engages the substrate 12 after the substrate has been detached from the carrier assembly 30. The substrate transporter 60 can further include one or more movable arms 61 that can robotically move the substrate 12 to the rinse chamber 50. The rinse chamber 50 can include a plurality of opposing spray bars 51, each having a plurality of nozzles 52 for directing a spray of the rinsing solution 53 onto the substrate 12. The rinse chamber 50 shown in FIG. 1 can simultaneously accommodate two substrates 12 positioned upright in adjacent bays 57.

A third approach to removing particulate matter from the substrate 12 is to remove the substrate from the polishing pad 41 and place the substrate 12 on a separate buffing pad (not shown). The buffing pad then moves relative to the substrate and may also be supplied with a rinsing solution to convey the particulate matter away.

After the substrate 12 has been planarized and rinsed, the polishing pad 41 can be conditioned to restore its ability to planarize additional substrates. Accordingly, the planarizing machine 10 can include a conditioner 70 that removes polishing pad material from the planarizing surface 42 to expose new polishing pad material. The conditioner 70 can include an abrasive disk 71 for mechanically roughening the planarizing surface 42 of the polishing pad 41. The conditioner 70 can also include a conditioning fluid source 72 that supplies conditioning fluid to the polishing pad 41 for chemically conditioning the planarizing surface 42 of the polishing pad 41.

Planarizing processes must consistently and accurately produce a uniformly planar surface on the microelectronic substrate 12 to enable precise fabrication of circuits and photo-patterns. As the density of integrated circuits increases, the uniformity and planarity of the substrate surface is becoming increasingly important because it is difficult to form sub-micron features or photo-patterns to within a tolerance of approximately 0.1 microns on non-uniform substrate surfaces. Thus, planarizing processes must create a highly uniform, planar surface on the substrate.

One drawback with the conventional methods discussed above is that they may not create a sufficiently planer surface on the substrate because particulates may remain attached to the substrate as a result of contact between the substrate 12 and a variety of chemical solutions during and after planarization. For example, in one conventional method the planarizing solution is an ammonia-based solution, and the rinsing and conditioning fluids are deionized water. Each chemical solution may have different chemical characteristics and sequentially exposing the microelectronic substrate 12 to different chemical solutions may cause particulates to adhere to the surfaces of the substrate. These particulates may damage the wafer during subsequent polishing and handling steps, or may interfere with subsequent processing steps, such as masking and etching. Furthermore, the particulates may become incorporated into the devices formed on the substrate, potentially causing the devices to fail.

In the competitive semiconductor and microelectronic device manufacturing industries, it is desirable to maximize the throughput of finished substrates. Accordingly, a further drawback with the conventional processes described above is that they may require additional time to remove the particulates from the substrate. The additional time can be required because the substrate has additional particulate adhered to it as a result of exposure to various chemical solutions.

SUMMARY OF THE INVENTION

The present invention is directed toward methods and apparatuses or processing a microelectronic substrate. In one embodiment, the apparatus can include a polishing pad having a planarizing surface and a source of planarizing liquid in fluid communication with the planarizing surface of the polishing pad. The microelectronic substrate is planarized by engaging the substrate with the polishing pad while the planarizing liquid is disposed on the polishing pad, and moving one of the substrate and the polishing pad relative to the other of the substrate and the polishing pad. As the relative motion between the substrate and the polishing pad is decreased, rinsing fluid having a pH approximately the same as a pH of the planarizing liquid can be introduced to the planarizing surface to maintain the pH of the microelectronic substrate at an approximately constant level.

In another embodiment, the microelectronic substrate can be removed from the polishing pad and rinsed remotely with a rinsing liquid having a pH approximately the same as a pH of the planarizing liquid. The rinsing liquid in either of the foregoing embodiments can be selected to include tetramethyl ammonium hydroxide and deionized water, or other substances where a pH of the rinsing liquid is approximately the same as the pH of the planarizing liquid.

In still another embodiment, the polishing pad can include a non-abrasive polishing pad and the planarizing liquid can include an abrasive slurry. The pH of the microelectronic substrate can be maintained by maintaining the pH of the abrasive slurry at an approximately constant level as the relative velocity between the microelectronic substrate and the polishing pad is reduced to approximately zero.

In yet another embodiment of the invention, the polishing pad can be conditioned by supplying to the polishing pad a conditioning liquid having a pH approximately the same as the pH of the planarizing liquid. In still a further embodiment, the microelectronic substrate can be cleaned by engaging the microelectronic substrate with the polishing pad, after the polishing pad has been conditioned, and moving at least one of the polishing pad and the substrate relative to the other of the polishing pad and the substrate.

DETAILED DESCRIPTION OF THE INVENTION

The present invention is an apparatus and method for mechanical and/or chemical-mechanical planarization of substrates used in the manufacture of microelectronic devices. Many specific details of certain embodiments of the present invention are set forth in the following description and in FIGS. 2–3 to provide a thorough understanding of such embodiments. One skilled in the art, however, will understand that the present invention may have additional embodiments or that the invention may be practiced without several of the details described in the following description.

Figure 1:
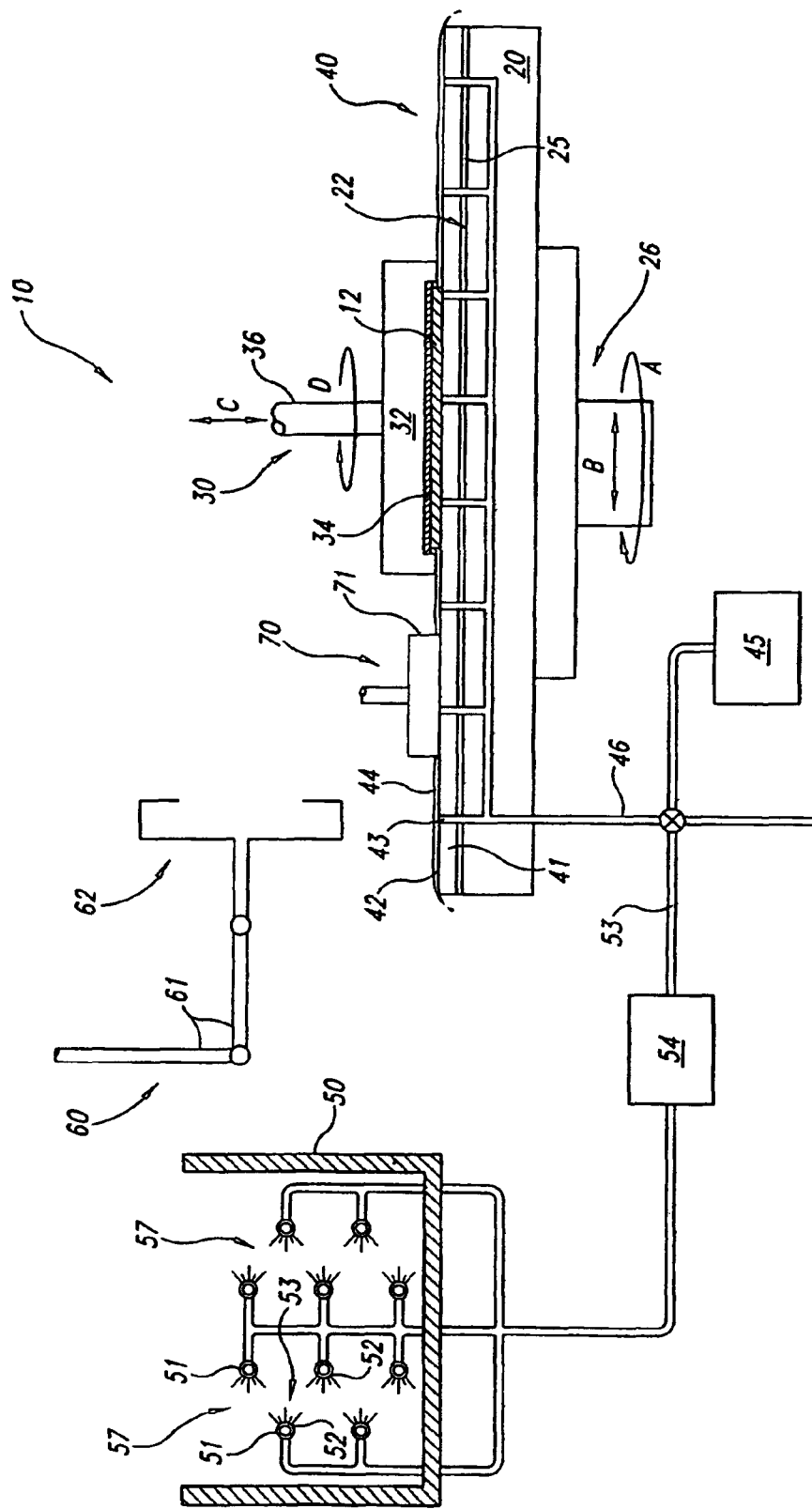
FIG. 1 is a schematic side elevation view of a planarizing machine in accordance with the prior art.
Figure 2:
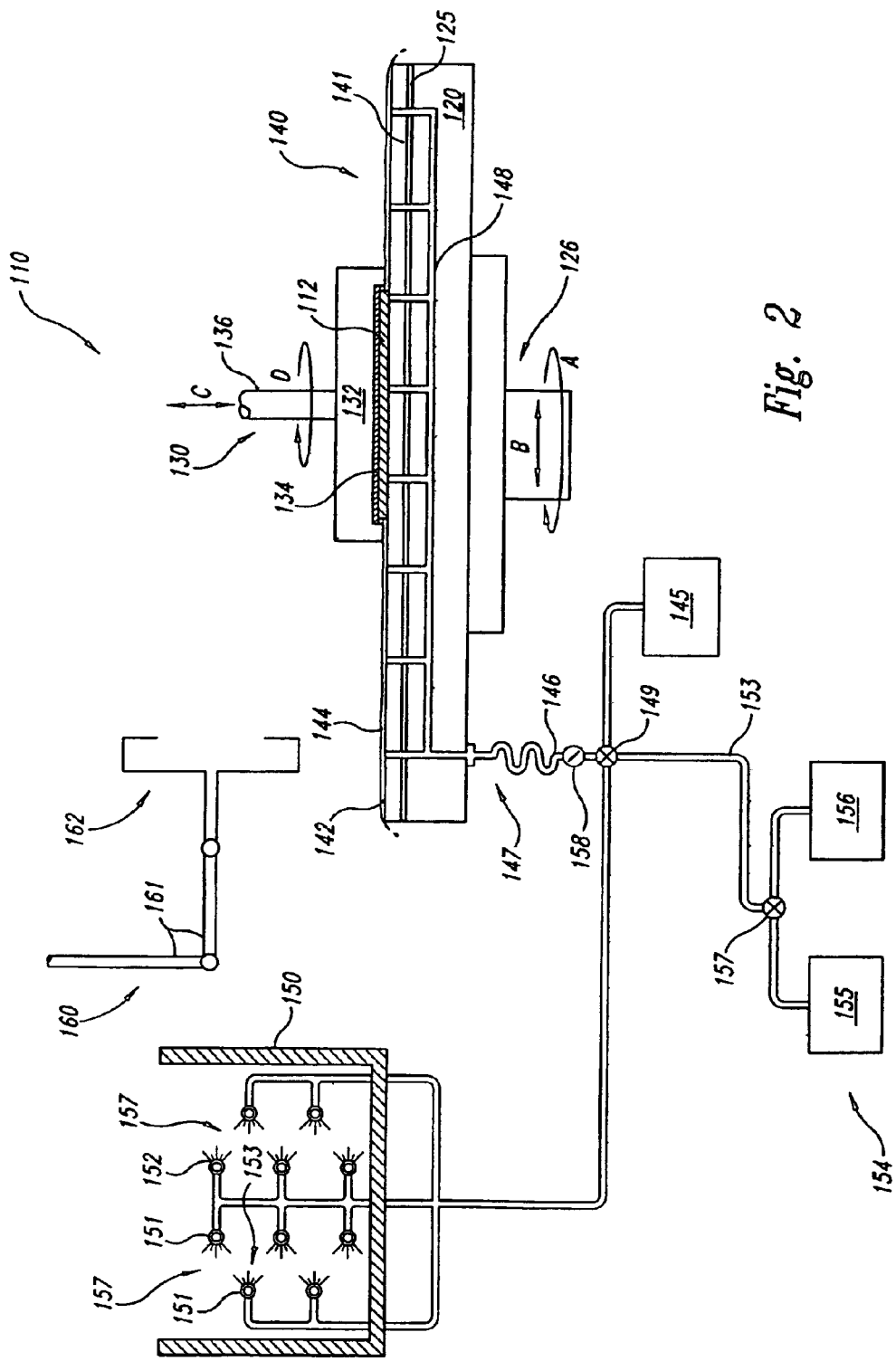
FIG. 2 is a schematic side elevation view of a planarizing machine having a source of rinsing liquid and a source of planarizing liquid, each liquid having an approximately equal pH in accordance with an embodiment of the present invention.

FIG. 2 is a schematic side elevation view of a CMP machine 110 having a platen 120 and a planarizing medium 140. In one embodiment, the CMP machine can include a model number 676 manufactured by IPEC Corp. of Portland, Oreg., and in other embodiments, the CMP machine can include other devices, such as a web-format planarizing machine, manufactured by EDC Corporation. In the embodiment shown in FIG. 2, the planarizing medium 140 includes a polishing pad 141 and an under-pad 125 releasably attached to the platen 120. The planarizing medium can further include a planarizing liquid 144 disposed on a planarizing surface 142 of the polishing pad 141. The platen 120 can be movable by means of a platen drive assembly 126 that can impart a rotational motion (indicated by arrow A) and/or a translational motion (indicated by arrow B) to the platen 120. As was discussed above, the CMP apparatus 110 can also include a carrier assembly 130 having a substrate holder 132 and a resilient pad 134 that together press a microelectronic substrate 112 against the planarizing surface 142 of the polishing pad 141. A carrier drive assembly 136 can be coupled to the carrier assembly 130 to move the carrier assembly axially (indicated by arrow C) and/or rotationally (indicated by arrow D) relative to the platen 120.

The planarizing liquid 144 can be supplied to the polishing pad 141 from a planarizing liquid supply 145 via a conduit 146. In one embodiment, the conduit 146 can include a flexible coupling 147, shown schematically in FIG. 2, to allow for translational or rotational motion of the platen 120 relative to the planarizing liquid supply 145. The coupling 147 can be connected to a manifold 148 in the platen 120. The manifold 148 can include a plurality of orifices 143 that extend upwardly through the under-pad 145 and the polishing pad 141 to the planarizing surface 142 of the polishing pad. As the carrier assembly 130 moves relatively to the platen 120, the planarizing medium 140 (i.e., the polishing pad 141 and/or the planarizing liquid 144) removes material from the microelectronic substrate 112. The process may also cause material to be removed from the polishing pad 141.

Particulates removed from the microelectronic substrate 112 and the polishing pad 141, as well as abrasive elements in the planarizing liquid 144 may tend to adhere to the microelectronic substrate 112. Accordingly, the CMP machine 110 can include a rinsing liquid 153 that is pumped from a rinsing liquid supply 154 through the conduit 146 to the orifices 143 in the polishing pad 141. The conduit 146 can include a valve 149 that can be adjusted to couple the rinsing liquid supply 154 and/or the planarizing liquid supply 145 with the orifices 143, to selectively provide rinsing liquid 153 and/or planarizing fluid 144 to the polishing pad 141.

It has been observed that particulates adjacent to the substrate 112 may have a greater tendency to adhere to the substrate 112 when the pH of the substrate changes suddenly. Accordingly, in one embodiment of the invention, the rinsing liquid 153 is selected to have a pH approximately the same as a pH of the planarizing liquid 144, to maintain the pH of the substrate 112 at an approximately constant level as the substrate 112 is exposed to the rinsing liquid 153. In one embodiment, the CMP machine 110 can include a pH meter 158 coupled to the rinsing liquid supply 154 and the planarizing liquid supply 145 to monitor the pH levels of both liquids. The pH meter can include a conductivity meter or other device that detects pH.

In one embodiment, the planarizing liquid 144 can include Klebosol, an ammonia-based solution available from Rodel Corp. of Newark, Del. having a pH in the range of approximately 10.6 to approximately 11.4, and more particularly, approximately 11.0. The pH of the rinsing liquid 153 can be selected to have a pH in approximately the same range. In one embodiment, the rinsing liquid 153 can include a mixture of deionized water provided by a deionized water supply 155 and tetramethyl ammonium hydroxide (TMAH) provided by a TMAH supply 156. The relative amount of deionized water and TMAH included in the rinsing liquid 153 can be controlled by adjusting a rinsing liquid valve 157 coupled between the deionized water supply 155 and the TMAH supply 156. In one embodiment, the rinsing liquid 153 can include 99.994% deionized water and 0.006% TMAH by volume, to have a pH of approximately 11.0. In other embodiments, the planarizing liquid 144 and the rinsing liquid 153 can include other compositions having other pHs, so long as the pH of the rinsing liquid 153 is selected to be approximately the same as the pH of the planarizing liquid 144.

In another aspect of this embodiment, the rinsing liquid 153 can be selected to have an electrical charge that is approximately the same as an electric charge of the planarizing liquid 144. For example, in one embodiment, the electrical charge of the rinsing liquid 153 and the planarizing liquid 144 can be selected to be approximately zero to reduce the likelihood of imparting unwanted electrical charges to the substrate 112. In other embodiments, the substrate 112, the rinsing liquid 153, and/or the planarizing liquid 144 can have other non-zero electrical charges.

The CMP machine 110 can also include a substrate transporter 160 and a rinse chamber 150. As was discussed above, the substrate transporter 160 can include a plurality of articulated movable arms 161 coupled to a grasping device 162. The grasping device 162 can engage the substrate 112 after it has been released from the carrier assembly 130 and the arms 161 can be controlled to robotically transfer the substrate 112 to the rinse chamber 150. The rinse chamber 150 can include spray bars 151 positioned on opposite sides of adjacent rinse bays 157. The spray bars 151 can direct the rinsing liquid 153 through nozzles 152 toward the substrate 112 to clean opposing surfaces of the substrate 112 when the substrate is positioned in one of the rinse bays 157.

The rinsing liquid 153 can have a pH that is approximately the same as the pH of the planarizing liquid 144, to maintain the pH of the substrate 112 at an approximately constant level for an additional portion of the post-planarization processing operation. In one aspect of this embodiment, the rinsing fluid 153 can be supplied from the same rinsing liquid supply 154 that supplies rinsing liquid the polishing pad 141. Accordingly, the valve 149 can be adjustable to provide the rinsing solution 153 to the polishing pad 141 and/or the rinsing chamber 153, as well as provide the planarizing liquid 144 to the polishing pad 141.

In operation, the planarizing liquid 144 is pumped from the planarizing liquid supply 145 through the orifices 143. The microelectronic substrate 112 engages the planarizing surface 142 of the polishing pad 141 while the platen 120 and/or the carrier assembly 130 are moved relative to each other to planarize the microelectronic substrate 112. As the planarizing process nears completion, the relative velocity between the microelectronic substrate 112 and the polishing pad 141 is ramped down or reduced to zero by gradually halting the motion of the platen 120 and/or the carrier assembly 130.

As the relative velocity between the substrate 112 and the platen 120 decreases, the flow of planarizing liquid 144 is halted and the rinsing liquid 153 is supplied to the polishing pad 141. In one embodiment, the time required to halt the relative motion between the substrate 112 and the polishing pad 141 (and accordingly, the time during which the substrate 112 is rinsed on the polishing pad 141), is in the range of approximately twenty to approximately forty seconds, and preferably approximately forty seconds. In other embodiments, the substrate 112 can be rinsed on the polishing pad 141 for greater or lesser periods of time, depending upon, for example, the initial relative velocity between the substrate 112 and the polishing pad 141, the normal force between the substrate 112 and the polishing pad 141, and the fluid characteristics of the planarizing liquid 144 and the rinsing liquid 153.

Once the relative motion between the microelectronic substrate 112 and the polishing pad 141 is halted, the carrier assembly 130 disengages from the substrate 112 and the substrate transporter 160 engages the substrate 112 and removes the substrate from the polishing pad 141. The substrate transporter 160 moves the substrate 112 to the rinse chamber 150 where the substrate is sprayed with the rinsing solution 153. In one embodiment, the substrate 112 can be rinsed for approximately five seconds in the rinse chamber, and in other embodiments, the substrate may be rinsed for greater or lesser periods of times.

An advantage of the CMP machine 110 and the process described above with reference to FIG. 2 is that the substrate 112 can be maintained at an approximately constant pH level throughout the planarization, ramp down, and rinsing operations. This is advantageous because particulate matter, such as material removed from the substrate 112, material removed from the polishing pad 141, and/or abrasive particles in the planarizing liquid 144 may be less likely to adhere to the microelectronic substrate 112 when the pH of the substrate 112 remains approximately constant. Accordingly, the likelihood of contaminating the substrate 112 with particulate matter can be substantially reduced, increasing the number of defect-free substrates. The absence of particulate matter may also be advantageous because post-CMP processing steps, such as masking, may be more accurately performed without the interference created by the particulate matter.

Another advantage of the CMP machine 110 and process described above with reference to FIG. 2 is that the machine can increase the throughput of substrates 112. For example, conventional CMP methods that include changing the pH of the substrate 112 before all of the particulates have been removed may require that the substrate be rinsed in a rinse chamber for approximately thirty seconds. By contrast, the process described above can include rinse times in the rinse chamber 150 on the order of approximately five seconds.

Still referring to FIG. 2, the CMP machine 110 can be operated in accordance with another embodiment of the invention by supplying the planarizing fluid 144 to the polishing pad 141 during both the planarization and ramp-down steps. Accordingly, the pH of the microelectronic substrate 112 can remain approximately constant during both the planarization and ramp-down steps. The substrate 112 can then be moved directly to the rinse chamber 150 and rinsed with the rinsing liquid 153 without first rinsing the substrate 112 on the polishing pad 141. An advantage of this process is that it does not require the rinsing solution supply 154 to be coupled to the polishing pad 141, potentially simplifying the CMP machine 110. Conversely, an advantage of rinsing the substrate 112 on the polishing pad 141 before moving the substrate to the rinse chamber 150 is that the additional rinse step may increase the likelihood that any particulate matter adhering to the substrate 112 is removed.

Figure 3:
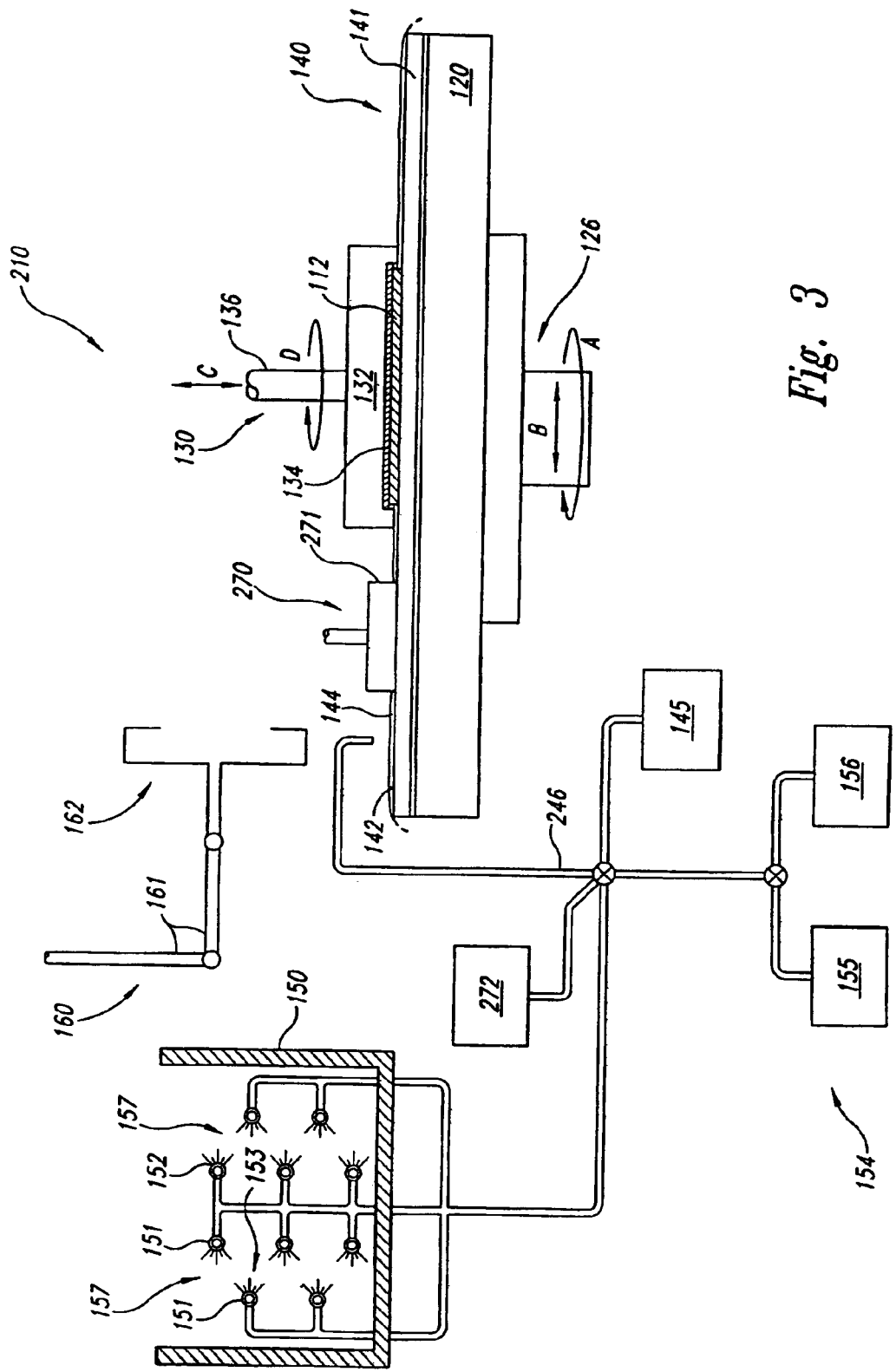
FIG. 3 is a schematic side elevation view of a planarizing machine having a source of conditioning liquid and a source of planarizing liquid, each liquid having an approximately equal pH in accordance with another embodiment of the present invention.

FIG. 3 is a schematic side elevation view of a CMP machine 210 having a conduit 246 that delivers fluid downwardly onto the planarizing surface 142 of the polishing pad 141, in accordance with another embodiment of the invention. Accordingly, an advantage of the CMP machine 210 when compared with the CMP machine 110 shown in FIG. 2 is that the need for orifices 143 (FIG. 2) and a manifold 148 (FIG. 2) is eliminated, potentially simplifying the construction and maintenance of the CMP machine 210. Conversely, an advantage of the CMP machine 110 is that it may more uniformly distribute the planarizing fluid 144 over the planarizing surface 142, and may distribute the planarizing fluid 144 independent of the location of the carrier assembly 130.

As is also shown in FIG. 3, the CMP machine 210 can include a conditioner 270 to refurbish the polishing pad 141 after planarization. In one embodiment, the conditioner 270 can include an abrasive disk 271 that roughens the planarizing surface 142 of the polishing pad 141 and removes polishing pad material from the planarizing surface. The conditioner 270 can also include a conditioning fluid source 272 in addition to or in lieu of the abrasive disk 271, for removing polishing pad material from the polishing pad 141. In one embodiment, the conditioning fluid can be chemically active to chemically remove the polishing material. In another embodiment, the conditioning fluid can be chemically inactive, but can act to flush the removed polishing pad material away from the polishing pad 141. In either case, a pH of the conditioning fluid can be selected to be approximately the same as the pH of the planarizing liquid 144. For example, the conditioning fluid can have the same chemical composition as the rinsing liquid 153. Accordingly, the conditioning fluid can be supplied by the rinsing solution supply 154 in one embodiment and the separate conditioning fluid source 172 can be eliminated.

In operation, the CMP machine 210 can be initially operated according to the steps discussed above with reference to FIG. 2 to planarize the substrate 112. In one embodiment, the substrate 112 can be moved directly to the rinse chamber after planarization (as was generally discussed above with reference to FIG. 2). Alternatively, the polishing pad 141 can be conditioned after planarization, and the substrate 112 can be buffed or cleaned on the conditioned polishing pad 141. For example, the polishing pad 141 can be conditioned by moving the abrasive disk 271 over the planarizing surface 142 and/or by flushing the planarizing surface 142 with the conditioning liquid. After the conditioning step has been completed, the substrate 112 can be buffed by moving the substrate 112 relative to the newly conditioned planarizing surface 142 in the presence of the rinsing solution 153. The buffing step can remove substrate material from the substrate 112 and/or can remove particulates that adhere to the surface of the substrate 112. In one embodiment, the ramp-down time can be reduced from a range of twenty to forty seconds to a range of approximately ten to approximately thirty seconds (preferably approximately fifteen seconds) when the ramp-down step is followed by the buffing step. Optionally, the substrate 112 can then be rinsed in the rinse chamber 150.

One advantage of the CMP machine 210 and the process discussed above with reference to FIG. 3 is that the conditioning fluid has a pH approximately the same as the pH of the planarizing liquid 144. Accordingly, the pH of the polishing pad 141 can be maintained at an approximately constant level, increasing the likelihood that the substrates 112 contacting the polishing pad 141 also remain at an approximately constant pH. As discussed above, keeping the pH of the microelectronic substrate 112 at an approximately constant level can reduce the tendency for particulate matter to adhere to the substrate 112.

Another advantage of the process described above with reference to FIG. 3 is that the microelectronic substrate 112 can be buffed on the same polishing pad 141 as was used to planarize the substrate 112, unlike some conventional methods which require a separate buffing pad. This is advantageous because it can reduce the number of pads necessary for CMP and post-CMP processing, and can also increase throughput by eliminating the step of moving the wafer from the polishing pad to a separate buffing pad.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for planarizing a microelectronic substrate with a planarizing machine having a planarizing medium that includes a non-abrasive polishing pad and an abrasive slurry, the method comprising:

moving one of the polishing pad and the microelectronic substrate relative to the other of the polishing pad and the microelectronic substrate to remove material from the microelectronic substrate; and maintaining a pH of the microelectronic substrate at an approximately constant level by maintaining a pH of the abrasive slurry at an approximately constant level while reducing a relative velocity between the microelectronic substrate and the polishing pad to approximately zero.

2. The method of claim 1 wherein maintaining the pH of the microelectronic substrate includes reducing attractive forces between the microelectronic substrate and the material removed from the microelectronic substrate.

3. The method of claim 1 wherein the polishing pad has a planarizing surface adjacent the microelectronic substrate, further comprising passing the abrasive slurry upwardly through openings in the planarizing surface of the polishing pad.

4. The method of claim 1 wherein the polishing pad has a planarizing surface adjacent the microelectronic substrate, further comprising depositing the abrasive slurry downwardly onto the planarizing surface of the polishing pad.

5. The method of claim 1, further comprising selecting the abrasive slurry to include ammonia.

6. The method of claim 1, further comprising selecting the abrasive slurry to have a pH in the range of approximately 10.6 to approximately 11.4.

7. The method of claim 1, further comprising selecting the abrasive slurry to have a pH of approximately 11.0.

8. The method of claim 1 wherein maintaining the pH of the microelectronic substrate includes reducing the relative velocity between the microelectronic substrate and the polishing pad to approximately zero over a period of time in the range of approximately twenty seconds to approximately forty seconds.

9. The method of claim 1, further comprising removing polishing pad material from the polishing pad by contacting the polishing pad with a conditioning liquid having a pH approximately equal to a pH of the abrasive slurry.

10. The method of claim 9 wherein the polishing pad has a planarizing surface for removing material from the microelectronic substrate, further comprising buffing the microelectronic substrate on the planarizing surface by engaging the microelectronic substrate with the polishing pad after removing polishing pad material from the planarizing surface and moving at least one of the polishing pad and the microelectronic substrate relative to the other of the polishing pad and the microelectronic substrate.

11. The method of claim 1, further comprising moving the microelectronic substrate from the polishing pad to a rinsing location spaced apart from the polishing pad and rinsing the microelectronic substrate at the rinsing location with a rinsing fluid having a pH approximately equal to a pH of the abrasive slurry.

12. The method of claim 11 wherein rinsing the microelectronic substrate includes rinsing the microelectronic substrate for a period of approximately five seconds.

13. The method of claim 11, further comprising selecting the rinsing liquid to include deionized water and tetramethyl ammonium hydroxide.

14. The method of claim 13 wherein selecting the rinsing liquid includes selecting a volume of the tetramethyl ammonium hydroxide to be approximately 0.006% of a volume of the deionized water.

15. The method of claim 11, further comprising selecting the rinsing liquid to have a pH in the range of approximately 10.6 to approximately 11.4.

16. The method of claim 11, further comprising selecting the rinsing liquid to have a pH of approximately 11.0.

* * * * *